US008450772B2

(12) United States Patent
Chang et al.

(10) Patent No.: US 8,450,772 B2
(45) Date of Patent: May 28, 2013

(54) PHASE CHANGE RAM DEVICE AND METHOD FOR MANUFACTURING THE SAME

(75) Inventors: Heon Yong Chang, Kyoungki-do (KR); Suk Kyoung Hong, Kyoungki-do (KR); Hae Chan Park, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 797 days.

(21) Appl. No.: 12/362,605

(22) Filed: Jan. 30, 2009

(65) Prior Publication Data
US 2009/0137081 A1     May 28, 2009

Related U.S. Application Data

(62) Division of application No. 11/445,651, filed on Jun. 2, 2006, now abandoned.

(30) Foreign Application Priority Data
Jun. 10, 2005  (KR) .................. 10-2005-0049782

(51) Int. Cl.
H01L 29/02     (2006.01)

(52) U.S. Cl.
USPC ............ 257/168; 257/E21.004; 257/E21.202; 257/E21.52; 438/102; 438/103; 438/482; 438/656; 438/756

(58) Field of Classification Search
USPC ............ 257/E21.004, E21.168, E21.202, 257/E21.52; 438/102, 103, 482, 656, 756, 438/757
See application file for complete search history.

(56) References Cited

U.S. PATENT DOCUMENTS

| | | | | |
|---|---|---|---|---|
| 2004/0165422 A1* | 8/2004 | Hideki et al. | ................ | 365/163 |
| 2004/0234895 A1* | 11/2004 | Lee et al. | ...................... | 430/311 |
| 2005/0227496 A1* | 10/2005 | Park et al. | ...................... | 438/745 |
| 2005/0250315 A1* | 11/2005 | Tran et al. | ...................... | 438/637 |
| 2006/0003515 A1* | 1/2006 | Chang | ......................... | 438/210 |

FOREIGN PATENT DOCUMENTS

| | | |
|---|---|---|
| JP | 2001-308096 A | 11/2001 |
| JP | 2003-100991 A | 4/2003 |
| JP | 2004-289029 A | 10/2004 |
| JP | 2004-311015 A | 11/2004 |
| JP | 2004-311729 A | 11/2004 |

* cited by examiner

Primary Examiner — Pho M Luu
(74) Attorney, Agent, or Firm — Ladas & Parry LLP

(57) ABSTRACT

A phase change RAM device includes a semiconductor substrate having a phase change cell area and a voltage application area; a first oxide layer, a nitride layer and a second oxide layer sequentially formed on the semiconductor substrate; a first plug formed in the first oxide layer, the nitride layer and the second oxide layer of the phase change cell area; a second plug formed in the first oxide layer and the nitride layer of the voltage application area; a conductive line formed in the second oxide layer; a third oxide layer formed on the second oxide layer; a lower electrode shaped like a plug, the lower electrode being formed so as to directly make contact with the first plug; and a phase change layer and an upper electrode sequentially formed on the lower electrode in a pattern form.

5 Claims, 5 Drawing Sheets

PHASE CHANGE RAM DEVICE AND METHOD FOR MANUFACTURING THE SAME

FIELD OF THE INVENTION

The present invention relates to a phase change Random Access Memory (hereinafter, referred to as RAM) device and a method for manufacturing a phase change RAM device. More particularly, the present invention relates to a phase change RAM device that can prevent an increase in cell size and a method for manufacturing such a phase change RAM device.

DESCRIPTION OF THE PRIOR ART

As is generally known, semiconductor memory devices may be classified into volatile RAM devices, in which information is lost when power is turned-off, and non-volatile Read Only Memory (hereinafter, referred to as ROM) devices in which information is not lost when power is turned-off. Volatile RAM may include dynamic random access memory or DRAM and static random access memory or SRAM. Non-volatile RAM may also include flash memory such as an Electrically Erasable and Programmable ROM (EEPROM).

While DRAM is an excellent memory device, it stores data using a capacitance effect and therefore requires a relatively high charge storage capability. As is known, the ability of a capacitor to store electrical charge is directly related to the spacing between the capacitors electrodes, the material between the electrodes and the area of the electrodes. For a given spacing and dielectric material, it is necessary to increase electrode surface area in order to increase capacitance. Therefore, it is difficult to highly integrate the DRAM.

Flash memory avoids some of the problems of DRAM but it requires an operation voltage higher than a power supply voltage in relation to its structure having two stacked gates. Since flash memory requires a separate boost circuit in order to generate voltage necessary for write and erase operations, it too is difficult to highly integrate the flash memory.

Much research has been actively conducted in order to develop a new memory device, which can be highly integrated while having the characteristics of the non-volatile RAM device, and has a simple structure. Recently, a phase change non-volatile RAM device has been proposed as a new memory device.

In a phase change RAM device, a phase change layer interposed between a lower electrode and an upper electrode changes from a crystalline state to an amorphous state through electric current flow between the electrodes. Herein, the phase change RAM device determines information stored in a cell by means of resistance difference caused according to crystalline and amorphousness.

In other words, the phase change RAM device uses a chalcogenide layer as a phase change layer. Such a chalcogenide layer corresponds to a chemical compound layer made from Germanium (Ge), Stibium (Sb) and tellurium (Te), and experiences phase change between an amorphous state and a crystalline state by applied electric current, i.e. Joule Heat. Herein, since a phase change layer with an amorphous state has specific resistance higher than that of a phase change layer with a crystalline state, the phase change RAM device detects electric current flowing through the phase change layer in write and read modes, and determines if information stored in a phase change memory cell represents logic "1" or "0".

FIG. 1 is a sectional view illustrating a conventional proposed phase change RAM device.

As illustrated in FIG. 1, gates 3 are formed on the active area of a semiconductor substrate 1 isolated by an isolation layer 2, and source/drain areas 4 and 5 are formed under a substrate surface on both sides of the gates 3.

A first oxide layer 6 is formed on the entire surface of the substrate 1 in order to cover the gates 3, and a first tungsten plug 7 and a second tungsten plug 8 are formed in the first oxide layer 6 on the drain area 5 with which a phase change cell is to make contact and the source area 4 to which voltage is to be applied.

A second oxide layer 9 is formed on the first oxide layer 6 including the first tungsten plug 7 and the second tungsten plug 8. Further, metal pads 10 shaped like dots and a conductive line 11 shaped like a bar are formed in the second oxide layer 9. In more detail, the metal pads 10 are formed on predetermined areas on which the phase change cell is to be formed according to a damascene process so that the metal pads 10 can make contact with the first tungsten plug 7, and the conductive line 11 is formed on a predetermined area to which voltage is to be applied so that the conductive line 11 can make contact with the second tungsten plug 8.

A third oxide layer 12 is formed on the second oxide layer 9 including the metal pads 10 and the conductive line 11, and lower electrodes 13 shaped like plugs are formed in the third oxide layer 12 of the areas on which the phase change cell is to be formed so that the lower electrodes 13 can make contact with the metal pads 10.

Phase change layers 14 and upper electrodes 15 are laminated on the third oxide layer 12 in a pattern form so that the phase change layers 14 and the upper electrodes 15 can make contact with the lower electrodes 13. In this way, the phase change cell is formed, which is comprised of the lower electrode 13, the phase change layer 14 laminated on the lower electrode 13, and the upper electrode 15 laminated on the phase change layer 14.

Further, a fourth oxide layer 16 is formed on the third oxide layer 12 in order to cover the phase change cell, and metal wires 17 for making contact with the upper electrodes 15 are formed on the fourth oxide layer 16.

However, in the phase change RAM device, the metal pads and the conductive line must be simultaneously formed in the second oxide layer on the upper part of the drain area on which the phase change cell is formed and the upper part of the source area to which voltage is applied. Since the metal pads and the conductive line are simultaneously formed in the same layer, it is necessary to ensure intervals between the metal pads and the conductive line. Therefore, the cell size inevitably increases.

SUMMARY OF THE INVENTION

In light of the foregoing problems with the prior art, an object of the present invention to provide a phase change RAM device capable of preventing an increase in cell size and a method for manufacturing the phase change RAM device.

In order to achieve the above objects, according to one aspect of the present invention, there is provided a phase change Random Access Memory (RAM) device including: a semiconductor substrate having a phase change cell area and a voltage application area; a first oxide layer, a nitride layer and a second oxide layer sequentially formed on the semiconductor substrate; a first plug formed in the first oxide layer, the nitride layer and the second oxide layer of the phase change cell area; a second plug formed in the first oxide layer and the nitride layer of the voltage application area; a conductive line formed in the second oxide layer on the second plug of the voltage application area; a third oxide layer formed on the second oxide layer including the first plug and the conductive line; a lower electrode shaped like a plug, the lower electrode being formed so as to directly make contact with the first plug in the third oxide layer of the phase change cell area; and a phase change layer and an upper electrode sequentially formed on the lower electrode in a pattern form.

In the phase change RAM device, the phase change cell area corresponds to a drain area of a transistor, and the voltage application area corresponds to a source area of the transistor.

In the phase change RAM device, the first plug, the second plug and the conductive line are made from tungsten.

In the phase change RAM device, the lower electrode is made from one of TiN, TiW, Al, Cu and Wsi.

In the phase change RAM device, the phase change layer is made from one of Ge—Sb—Te, Ge—Bi—Te, Sb—Te dope with at least one of Ag, In and Bi, and Bi—Te dope with at least one of Ag, In and Sn.

In the phase change RAM device, the upper electrode is made from one of Al, Ti, Ta, TaSiN, TaN, Ru, TiN, TiW and TiAlN.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION

Hereinafter, a preferred embodiment of the present invention will be described with reference to the accompanying drawings.

FIGS. 2A to 2G are sectional views according to steps in a method for manufacturing a phase change RAM device based on the present invention.

Figure 1:
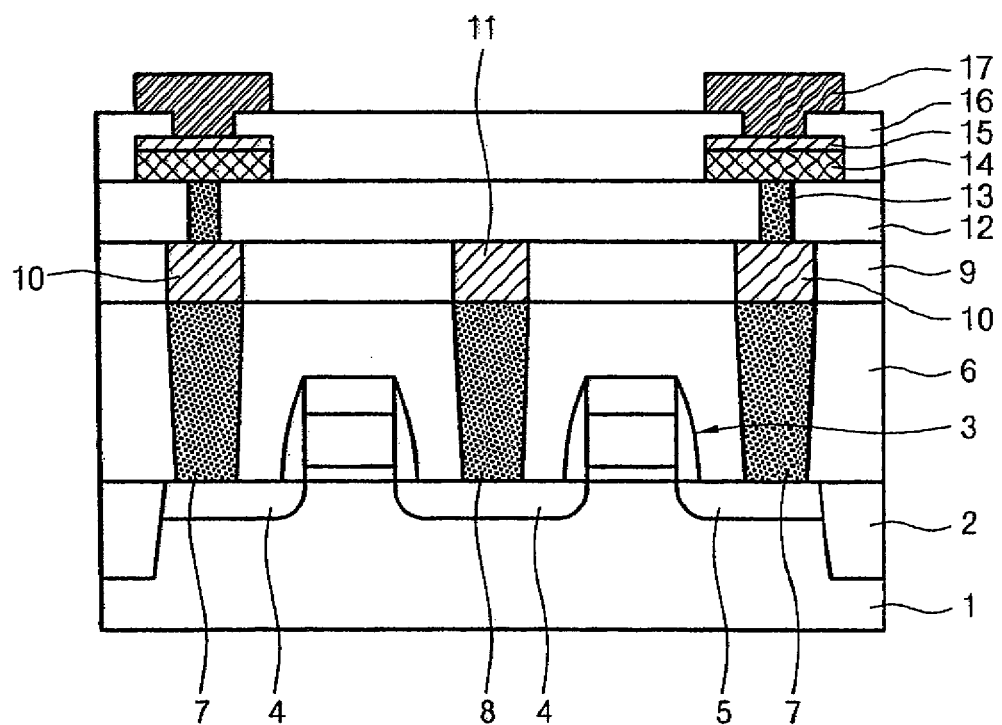
FIG. 1 is a sectional view illustrating a conventional phase change RAM device.
Figure 2A:
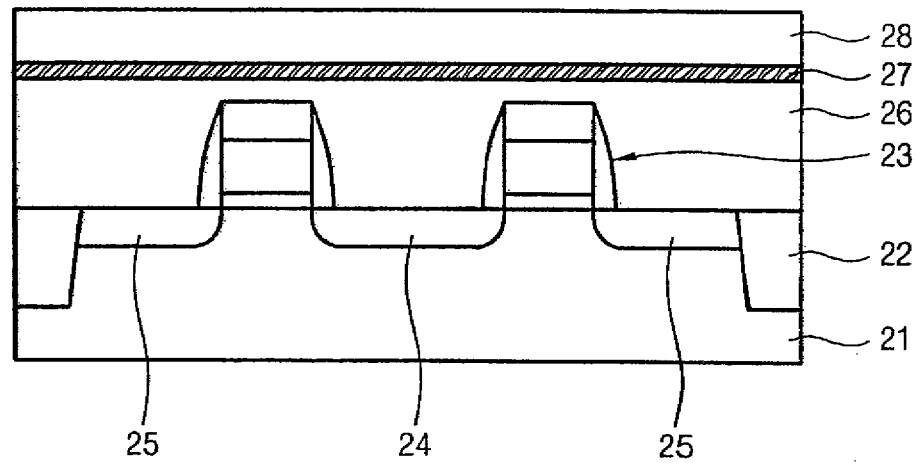
FIGS. 2A to 2G are sectional views according to steps in a method for manufacturing a phase change RAM device based on the present invention.

Referring to FIG. 2A, an isolation layer 22 is formed in a semiconductor substrate 21 according to a shallow trench isolation (STI) process so as to isolate an active area. Then, gates 23 are formed on the active area, which are isolated by the isolation layer 22, according to a well-known process, and a source area 24 and a drain area 25 are formed under a substrate surface on both sides of the gates 23 through high concentration ion implantation of impurity so as to create a transistor.

Next, a first oxide layer 26 is formed on the entire surface of the substrate 1 as an insulating interlayer in order to cover the transistor, and the surface of the first oxide layer 26 is planarized by an etchback process or a Chemical Mechanical Polishing (hereinafter, referred to as CMP) process. Then, a nitride layer 27 is deposited on the first oxide layer 26 with the planarized surface as an etch stopping layer, and a second oxide layer 28 is formed on the nitride layer 27.

Figure 2B:
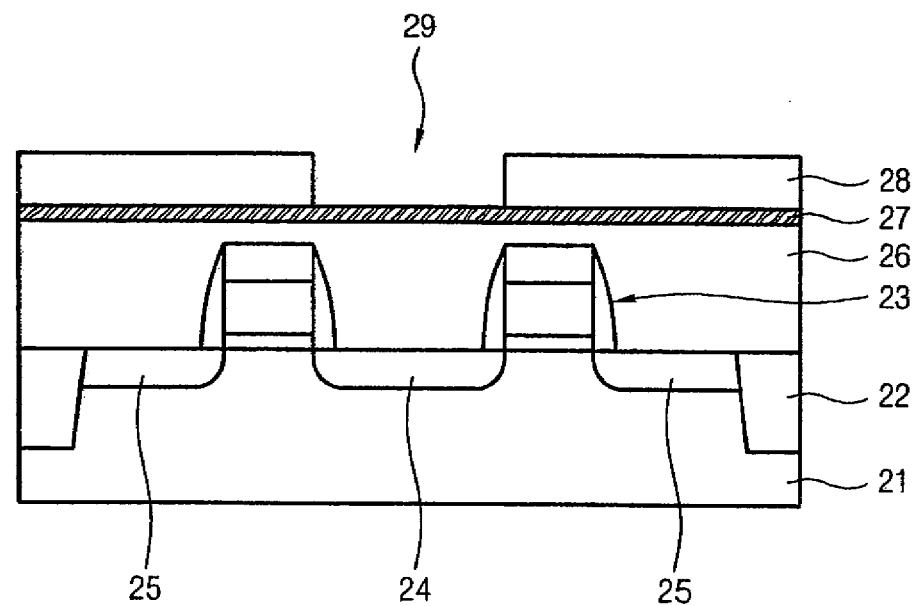

Referring to FIG. 2B, the second oxide layer 28 is partially etched by using the nitride layer 27 as an etch stopping layer. In this way, a trench 29 shaped like a bar for isolating an area, on which a conductive line is to be formed, is formed above the source area 24 to which voltage is to be applied.

In the present invention, only the trench 29 shaped like a bar is formed while holes shaped like dots for forming metal pads are not formed above the drain area 25 in contact with a phase change cell, as compared with the prior art. Therefore, it is not necessary to ensure intervals between the metal pad and the conductive line. Accordingly, the present invention can prevent an increase in cell size, which may be caused by ensuring the intervals between the metal pad and the conductive line.

Figure 2C:
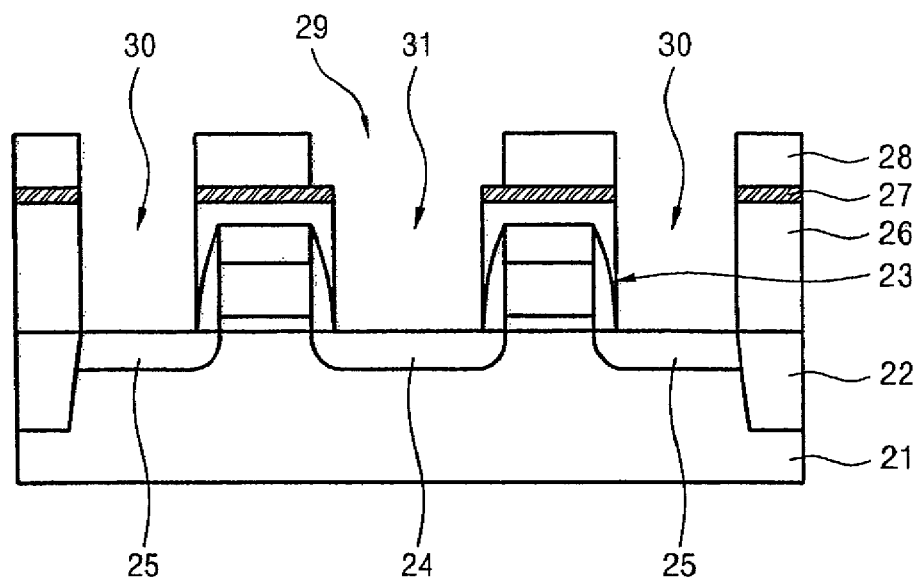

Referring to FIG. 2C, in a state in which a mask pattern for exposing the source area 24 and the drain area 25 has been formed on the second oxide layer 28, the nitride layer 27 is etched by means of the mask pattern. Then, the second oxide layer 28 and the first oxide layer 26 are etched, so that first contact holes 30 for exposing the drain area 25 in a phase change cell area are formed, and a second contact hole 31 for exposing the source area 24 in a voltage application area is formed.

Figure 2D:
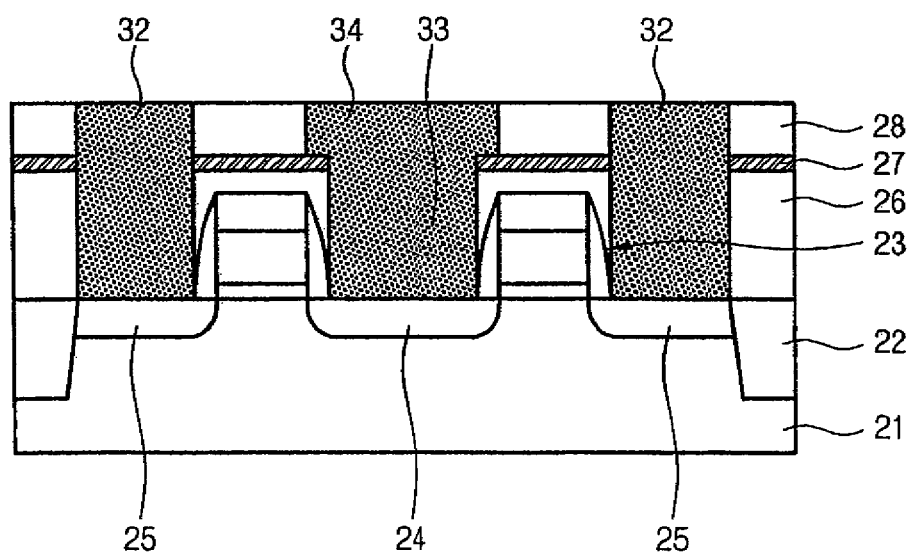

Referring to FIG. 2D, a plug conductive layer, e.g. a tungsten layer, is deposited on the second oxide layer 28 so as to completely fill in the trench 29 including the first contact holes 30 and the second contact hole 31. Then, the plug conductive layer is subjected to an etchback process or a CMP process so that first tungsten plugs 32 respectively making contact with the drain area 25 are formed in the first contact holes 30, and a second tungsten plug 33 is formed in the second contact hole 31. Simultaneously, a conductive line 34 is formed in the trench 29.

Herein, according to the present invention, the metal pad is not formed above the drain area 25, so that it is possible to prevent an increase in cell size, which may be caused by ensuring the intervals between the metal pad and the conductive line. In addition, the conductive line 34 and the tungsten plugs 32 and 33 are simultaneously formed, so that a process can be simplified, as compared with the prior art in which the tungsten plugs and the conductive line are respectively formed.

Figure 2E:
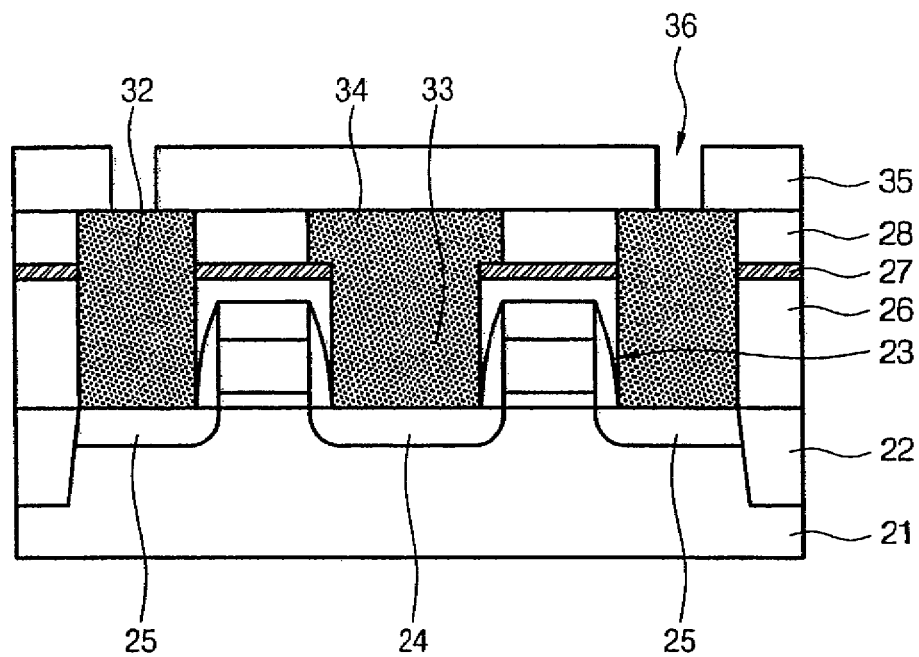

Referring to FIG. 2E, a third oxide layer 35 is formed on the second oxide layer 28 including the first tungsten plug 32 and the conductive line 34. Then, the third oxide layer 35 is etched so as to form a third contact hole 36 for a lower electrode, which has a fine size and exposes the first tungsten plugs 32 of an area in which a phase change cell is to be formed.

Since the third oxide layer 35 is formed on a generally planarized underlayer, i.e. the second oxide layer 28 including the first tungsten plug 32 and the conductive line 34, the third oxide layer 35 has a comparatively uniform thickness. Accordingly, it is possible to stably perform an E-beam process when forming the third contact hole 36.

Figure 2F:
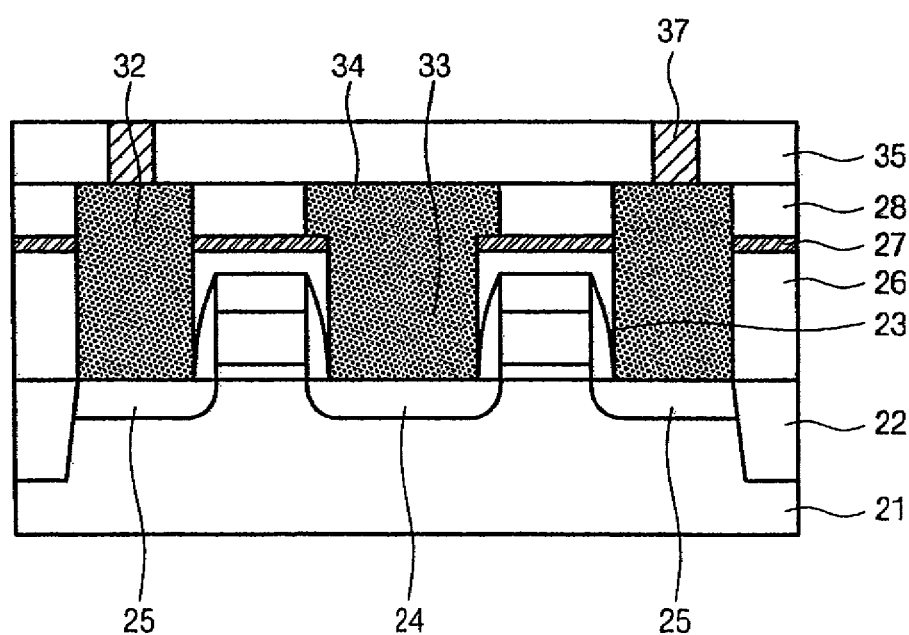

Referring to FIG. 2F, a lower electrode material layer is deposited on the third oxide layer 35 so as to fill in the third contact hole 36, i.e. one of TiN, TiW, Al, Cu and Wsi is deposited on the third oxide layer 35. Then, the lower electrode material layer is subjected to an etchback process, so that a lower electrode 37 is formed without an interposition of a metal pad within the third contact hole 36. The lower electrode 37 has a shape of a plug and directly makes contact with the first tungsten plug 32.

Figure 2G:
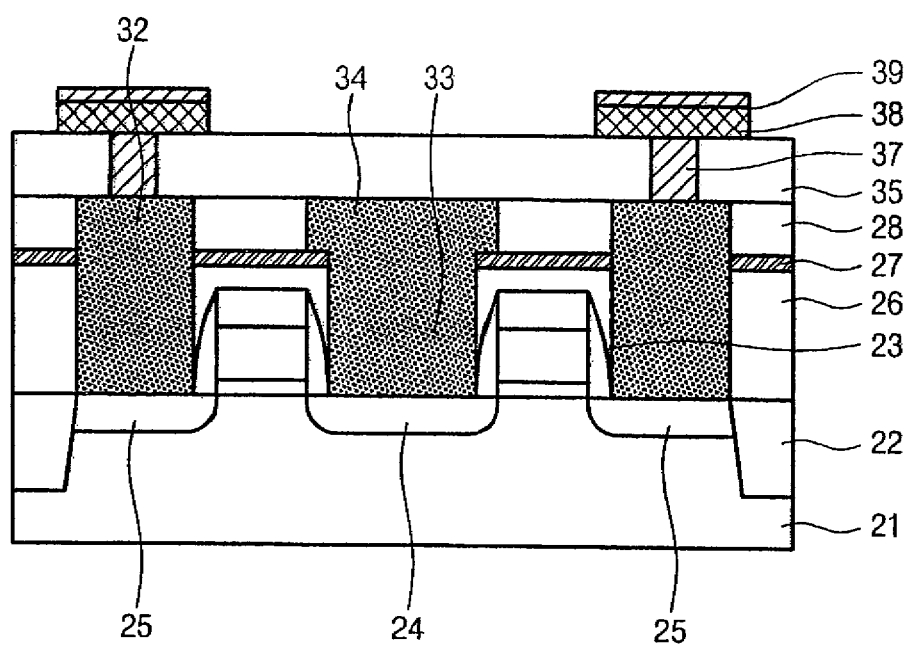

Referring to FIG. 2G, the third oxide layer 35 including the lower electrode 37 is subjected to a Chemical Vapor Deposition (CVP) process or an Atomic Layer Deposition (ALP) process, so that a phase change material layer is deposited. The phase change material layer uses Ge—Sb—Te or Ge—Bi—Te. Otherwise, the phase change material layer uses Sb—Te dope with at least one of Ag, In and Bi, or Bi—Te dope with at least one of Ag, In and Sn. Then, an upper electrode material layer, which contains Al, Ti, Ta, TaSiN, TaN, Ru, TiW, TiN, TiAlN, etc., is deposited on the phase change material layer.

Then, the upper electrode material layer and the phase change material layer under the upper electrode material layer are etched so as to form an upper electrode 39 and a phase change layer 38. In this way, a phase change cell is formed, which contains the lower electrode 37 shaped like a plug, the phase change layer 38 laminated on the lower electrode 37 in a pattern form, and the upper electrode 39 laminated on the phase change layer 38 in a pattern form.

Then, a series of well-known subsequent processes including a metal wiring process are sequentially accomplished, so that the phase change RAM device according to the present invention is completely manufactured.

According to the present invention as described above, a lower electrode shaped like plugs directly makes contact with a tungsten plug in contact with a drain area, so that it is possible to prevent a metal pad from being formed. Therefore, it is not necessary to ensure intervals between the metal pad and a conductive line on a source area to which voltage is applied. Accordingly, it is possible to effectively prevent an increase in cell size, which may be caused by ensuring the intervals between the metal pad and the conductive line.

Further, according to the present invention as described above, since a third oxide layer in which a lower electrode shaped like a plug is formed has a uniform thickness, it is possible to easily perform an E-beam process when forming a contact hole for a lower electrode. Specifically, the lower electrode shaped like a plug can have a uniform size throughout an entire area of a substrate through process stabilization, so that a contact area between the lower electrode and a phase change layer can have a uniform size throughout the entire area of the substrate. Accordingly, it is possible to lower the range of write current necessary for phase change of the phase change layer.

The preferred embodiment of the present invention has been described for illustrative purposes, and those skilled in the art will appreciate that various modifications, additions and substitutions are possible, without departing from the scope and spirit of the invention as disclosed in the accompanying claims.

What is claimed is:

1. A method for manufacturing a phase change Random Access Memory (RAM) device, the method comprising the steps of:
    providing a semiconductor substrate, the semiconductor substrate having an isolation layer for isolating an active area, a gate formed on the active area, and source and drain areas formed under a substrate surface on both sides of the gate;
    sequentially forming a first oxide layer, a nitride layer and a second oxide layer on an entire surface of the semiconductor substrate;
    etching the second oxide layer using the nitride layer as an etch stopping layer, thereby forming a trench shaped like a bar on the second oxide layer above the source area, without etching the second oxide layer above the drain area to prevent a metal pad from being formed above the drain;
    etching the first oxide layer, the nitride layer and the second oxide layer, thereby forming a first contact hole for exposing the drain area and a second contact hole for exposing the source area in a lower surface of the trench;
    filling in a conductive layer within the first contact hole, the second contact hole, and the trench, thereby forming a first plug making contact with the drain area in the first contact hole, forming a second plug making contact with the source area in the second contact hole, and forming a conductive line in the trench, wherein the conductive line is formed as one body with the second plug;
    forming a third oxide layer on the second oxide layer including the first plug and the conductive line;
    forming a lower electrode shaped like a plug, the lower electrode directly contact with the first plug in the third oxide layer above the drain area; and
    sequentially forming a phase change layer and an upper electrode on the lower electrode and the third oxide layer in a pattern form, the third oxide layer being adjacent to the lower electrode, wherein the phase change layer is formed so as to directly make contact with the lower electrode.

2. The method as claimed in claim 1, wherein the first plug, the second plug and the conductive line are made from tungsten.

3. The method as claimed in claim 1, wherein the lower electrode is made from one of TiN, TiW, Al, Cu and Wsi.

4. The method as claimed in claim 1, wherein the phase change layer is made from one of Ge—Sb—Te, Ge—Bi—Te, Sb—Te doped with at least one of Ag, In and Bi, and Bi—Te doped with at least one of Ag, In and Sn.

5. The method as claimed in claim 1, wherein the upper electrode is made from one of Al, Ti, Ta, TaSiN, TaN, Ru, TiN, TiW and TiAlN.

* * * * *